(12) United States Patent
Posseme et al.

(10) Patent No.: US 12,215,430 B2
(45) Date of Patent: Feb. 4, 2025

(54) METHOD FOR INCREASING THE SURFACE ROUGHNESS OF A METAL LAYER

(71) Applicant: COMMISSARIAT À L'ÉNERGIE ATOMIQUE ET AUX ÉNERGIES ALTERNATIVES, Paris (FR)

(72) Inventors: Nicolas Posseme, Grenoble (FR); Laurent Grenouillet, Grenoble (FR); Olivier Pollet, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 572 days.

(21) Appl. No.: 17/535,147

(22) Filed: Nov. 24, 2021

(65) Prior Publication Data

US 2022/0173163 A1    Jun. 2, 2022

(30) Foreign Application Priority Data

Nov. 27, 2020   (FR) ...................................... 2012282

(51) Int. Cl.
*C23F 1/02* (2006.01)
*C23F 4/00* (2006.01)
(Continued)

(52) U.S. Cl.
CPC .................. *C23F 1/02* (2013.01); *C23F 4/00* (2013.01); *H01J 37/32522* (2013.01);
(Continued)

(58) Field of Classification Search
None
See application file for complete search history.

(56) References Cited

U.S. PATENT DOCUMENTS 6,464,889 B1 * 10/2002 Lee .......................... A61L 27/50
216/75
2015/0132953 A1    5/2015 Nowling et al.

FOREIGN PATENT DOCUMENTS

EP    1 475 848 A1    11/2004
FR    2 941 560 A1    7/2010
(Continued)

OTHER PUBLICATIONS

Search Report as issued in French Patent Application No. 2012282, dated Sep. 14, 2021.
(Continued)

*Primary Examiner* — Jiong-Ping Lu
(74) *Attorney, Agent, or Firm* — Pillsbury Winthrop Shaw Pittman LLP

(57) ABSTRACT

A method for increasing the surface roughness of a layer based on a metal having a catalytic power, includes fixing fluorine or chlorine on the surface of the metal based layer, by exposing the metal based layer to a plasma formed from a reactive gas containing fluorine or chlorine; exposing the surface of the metal based layer to a humid environment to produce an acid, by reaction of hydrogen from the humid environment with the fluorine or the chlorine fixed on the surface of the metal based layer, the acid reacting with the metal to form residues, the whole of the residues forming a pattern on the surface of the metal based layer, and etching the metal based layer through the residues, so as to transfer the pattern into the metal based layer.

11 Claims, 2 Drawing Sheets

(51) Int. Cl.
  *H01J 37/32*  (2006.01)
  *H10B 63/00*  (2023.01)
  *H10N 70/00*  (2023.01)
  *H10N 70/20*  (2023.01)

(52) U.S. Cl.
  CPC ........... *H10B 63/22* (2023.02); *H10N 70/011* (2023.02); *H10N 70/063* (2023.02); *H10N 70/20* (2023.02); *H10N 70/826* (2023.02); *H10N 70/841* (2023.02); *H10N 70/8833* (2023.02); *H01J 2237/2001* (2013.01); *H01J 2237/3341* (2013.01)

(56) References Cited

FOREIGN PATENT DOCUMENTS

FR  3 027 450 A1  4/2016
FR  3 027 453 A1  4/2016

OTHER PUBLICATIONS

Charpin-Nicolle, C., et al., "Impact of roughness of TiN bottom electrode on the forming voltage of HfO_2 based resistive memories," Microelectronic Engineering, (2020), vol. 221, 6 pages.
Posseme<N., et al., "Residue growth on metallic-hard mask after dielectric. Etching in fluorocarbon-based plasmas. I. Mechanisms," J. Vac. Sci. Technol. B 28(4), Jul./Aug. 2010, pp. 809-816.
Search Report as issued in European Patent Application No. 21210678.5, dated Feb. 9, 2022.

\* cited by examiner

METHOD FOR INCREASING THE SURFACE ROUGHNESS OF A METAL LAYER

CROSS-REFERENCE TO RELATED APPLICATIONS

This application claims priority to French Patent Application No. 2012282, filed Nov. 27, 2020, the entire content of which is incorporated herein by reference in its entirety.

TECHNICAL FIELD

The present invention relates to a method for increasing the surface roughness of a metal layer and the application thereof during the manufacture of a resistive random access memory cell.

PRIOR ART

In a metal-insulator-metal (MIM) type electronic device such as a capacitor or a resistive random access memory cell, the surface roughness of the metal layers forming the electrodes may have a significant impact on the electrical properties of the device.

For example, in an oxide-based resistive random access memory (OxRAM) cell comprising a lower electrode, an upper electrode and an active material of variable electrical resistance arranged between the electrodes, the roughness of the lower electrode has an influence on the so-called forming voltage of the memory cell. The forming voltage of an OxRAM cell is the voltage value at which the memory cell switches from a virgin state, characterised by a very high resistance (so-called initial resistance), to a low resistance state. The forming voltage is greater than the nominal operating voltage of the memory cell, which makes it possible to erase or to write the memory cell (passage from the low resistance state to a high resistance state, or vice versa).

In the article ["Impact of roughness of TiN bottom electrode on the forming voltage of $HfO_2$ based resistive memories", Microelectronic Engineering, 2020, vol. 221, p. 111194], C. Charpin-Nicolle et al. show that increasing the roughness of the lower electrode made of titanium nitride (TiN) has the effect of decreasing the forming voltage of the memory cell. A lower forming voltage is advantageous, because it makes it possible to reduce the size of the memory circuit (selection transistors, voltage generator circuit) and to improve the endurance of memory cells.

The lower TiN electrode is made rougher by exposure to a reactive ion etching (RIE) plasma. Different plasma chemistries each associated with particular etching conditions have made it possible to vary the surface roughness in root mean square value from 0.4 nm to 14 nm.

The increase in roughness by RIE necessitates however developing a specific recipe for each electrode material, while playing on numerous method parameters (mixture of reactive gases and concentrations, pressure, RF power, temperature, etc.). However, for certain metals, it proves to be impossible to generate roughness by RIE, no set of parameters making it possible to activate a random and non-uniform etching mechanism.

Furthermore, the document EP1475848A1 discloses a method for etching a stack of layers for the manufacture of phase change memory cells. The stack notably comprises a first layer of titanium, a layer of phase change material (GST) arranged on the first layer of titanium, a second layer of titanium arranged on the layer of phase change material and a layer of aluminium-copper (AlCu) arranged on the second layer of titanium. The method comprises several etching steps, of which:
a first step of $Cl_2+BCl_3+N_2$ plasma etching to etch the stack until reaching the second layer of titanium;
a second step of $Cl_2+BCl_3+Ar+O_2+N_2$ plasma etching to etch the stack until reaching the first layer of titanium.

The method also comprises, between these two etching steps, a step of forming an alumina ($Al_2O_3$) passivation layer on the sides of the AlCu layer, by exposure to a $H_2O$ plasma.

SUMMARY OF THE INVENTION

There exists a need to provide a method for increasing the surface roughness of a metal based layer, which is simple to implement and applicable to several metals.

According to a first aspect of the invention, this need tends to be satisfied by providing a so-called "roughening" method comprising the following steps:
fixing fluorine or chlorine on the surface of the metal based layer, by exposing the metal based layer to a plasma formed from a reactive gas containing fluorine or chlorine;
exposing the surface of the metal based layer to a humid environment to produce an acid, by reaction of hydrogen from the humid environment with the fluorine or the chlorine fixed on the surface of the metal based layer, the acid reacting with the metal to form residues, the whole of the residues forming a pattern on the surface of the metal based layer;
etching the metal based layer through the residues, so as to transfer the pattern into the metal based layer.

This method makes it possible to increase the roughness of a metal layer without having need to develop a plasma etching recipe specific to each metal, because the roughness is generated on the surface of the metal based layer, by growth of residues (or deposits) comprised of a metal salt, before being transferred into the metal based layer. A conventional etching method (that is to say not optimised for the generation of roughness) may be employed to accomplish this transfer.

Preferably, the metal based layer is etched by means of an etching method having a selectivity with respect to the residues comprised between 1 and 2.

The metal based layer is advantageously etched until all the residues are removed.

The metal is preferably selected from titanium (Ti), titanium nitride (TiN), tantalum (Ta) and tantalum nitride (TaN).

The reactive gas may be a non-polymerising gas containing fluorine, for example sulphur hexafluoride ($SF_6$) or nitrogen trifluoride ($NF_3$).

Alternatively, the plasma is formed from a mixture of reactive gases comprising a fluorocarbon gas ($C_xF_y$) and a depolymerising gas.

The humid environment may be ambient air or generated in a chamber of a plasma reactor.

The roughening method may further comprise a step of oxidation of the surface of the metal based layer before the step of formation of residues.

A second aspect of the invention relates to a method for manufacturing a resistive random access memory cell comprising a first electrode, a second electrode and a resistive layer arranged between the first and second electrodes, the method comprising the following steps:
depositing a first metal layer on a substrate;

increasing the roughness of the first metal layer by means of a method according to the first aspect of the invention;

depositing a layer of material with variable electrical resistance on the first metal layer and a second metal layer on the layer of material with variable electrical resistance;

etching the first metal layer, the layer of material with variable electrical resistance and the second metal layer, so as to delimit respectively the first electrode, the resistive layer and the second electrode of the resistive random access memory cell.

BRIEF DESCRIPTION OF THE FIGURES

Other characteristics and advantages of the invention will become clear from the description that is given thereof below, for indicative purposes and in no way limiting, with reference to the following figures.

For greater clarity, identical or similar elements are marked by identical reference signs in all of figures.

DETAILED DESCRIPTION

Figure 1A:
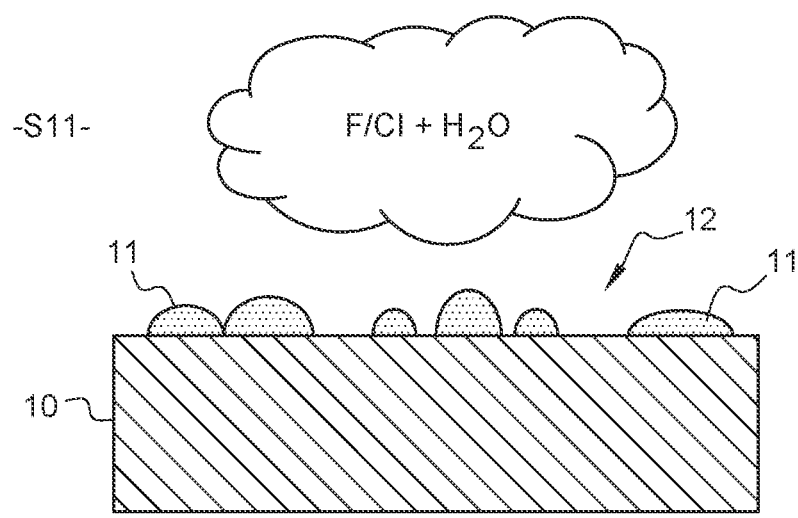
FIG. 1A and FIG. 1B represent the steps of a method for increasing the surface roughness of a metal layer.
Figure 1B:
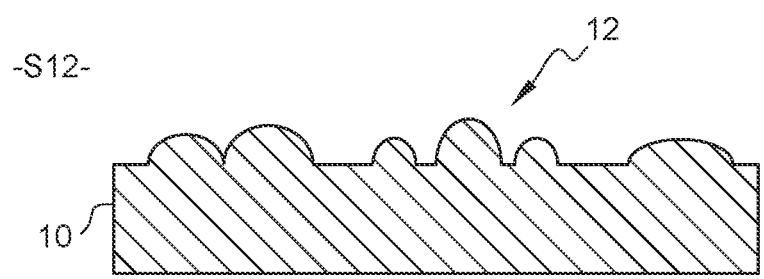

FIGS. 1A and 1B schematically represent steps S11 and S12 of a method for increasing the roughness of a layer 10 based on a metal having a catalytic power, also called metal layer 10. Metal layer is taken to mean a layer formed of a material of which the atoms are bound by metal bonds.

The metal layer 10 may be comprised either of a metal, or a metal alloy, or a metal compound, or further a mixture of several metal compounds. This layer is preferentially based on titanium, tantalum, tungsten, gold, nickel and/or aluminium. It may thus be a layer made of titanium, a layer made of tantalum, a layer made of tungsten, a layer made of gold, a layer made of nickel, a layer made of aluminium, a layer made of an alloy of at least two of these metals, a layer made of a compound of titanium, tantalum, tungsten, gold, nickel and/or aluminium, or instead a layer made of a mixture of several compounds of titanium, tantalum, tungsten, gold, nickel and/or aluminium. Preferably, the metal based layer is made of titanium, tantalum, titanium nitride, tantalum nitride, titanium oxynitride or titanium oxynitride.

The metal layer 10 may be arranged on a substrate (not represented), for example made of silicon. It is for example formed by physical vapour deposition (PVD). Its thickness is preferably greater than or equal to 100 nm.

The metal layer 10 initially (i.e. immediately after its deposition) has a surface roughness strictly less than 1 nm. This roughness value, as well as all those given hereafter, are expressed in root mean square value. The root mean square roughness (noted Rq) is determined by a statistical analysis of an atomic force microscopy image, taking as sample a surface of $5 \times 5$ μm$^2$.

With reference to FIG. 1A, the method for increasing roughness, also called roughening method, comprises a first step S11 of formation of residues 11 on a surface of the metal layer 10. The residues 11 are outgrowths of random shape and distributed in a non-uniform manner on the surface of the metal layer 10. Together, they form a pattern 12 on the surface of the metal layer 10.

The residues 11 are comprised of a metal salt (metal oxyfluoride or metal oxychloride residues) and are produced by a chemical reaction of the metal with an acid containing fluorine or chlorine, for example hydrofluoric acid (HF) or hydrochloric acid (HCl).

In a first embodiment of step S11, the residues 11 are formed by exposure of the metal layer 10 to an aqueous solution of hydrofluoric acid (HF) or hydrochloric acid (HCl). As an example, the surface of the metal layer 10 is immersed in an HF solution of concentration comprised between 1% and 5% for a duration comprised between 30 s and 120 s.

In a second embodiment, the residues 11 are formed by exposure of the metal layer 10 to a plasma, then to a humid environment. The plasma is formed from a reactive gas containing fluorine or chlorine.

The fluorine (respectively the chlorine) contained in the plasma fixes onto the surface of the metal layer 10 during a first so-called "fluorination" (respectively "chlorination") operation, then reacts with hydrogen from the humid environment during a second operation to produce the acid. Next, the acid reacts with the metal of the layer 10 to form the residues 11. This mechanism of formation of the residues 11 is described in detail in the document ["Residue growth on metallic-hard mask after dielectric etching in fluorocarbon-based plasmas. I. Mechanisms", N. Posseme et al., Journal of Vacuum Science & Technology B 28(4), pp. 809-816, 2010] incorporated here as a reference.

The plasma used in the second embodiment of step S11 has no etching role, unlike the plasmas used in the etching method of the document EP1475848A1. In other words, it does not etch the metal layer 10. Its role is uniquely to fix chlorine or fluorine on the surface of the metal layer 10, in order to obtain a surface rich in fluorine/chlorine.

The plasma may be formed in any type of plasma reactor, for example an RIE (reactive ion etching) reactor. An RIE reactor notably comprises a chamber in which the plasma is generated, a radiofrequency (RF) antenna called "source generator" and a substrate holder called "bias generator", on which is arranged the substrate (covered with the metal layer 10). The substrate holder makes it possible to apply a bias to the substrate.

Preferably, the reactive gas used to form the plasma is a non-polymerising gas containing fluorine, such as sulphur hexafluoride ($SF_6$) or nitrogen trifluoride ($NF_3$).

The plasma may be generated in a RIE reactor in the following conditions:

- a flow rate of $SF_6$ comprised between 10 sccm and 100 sccm (abbreviation of "Standard Cubic Centimetres per Minute", i.e. the number of cm$^3$ of gas flowing per minute in standard pressure and temperature conditions, i.e. at a temperature of 0° and a pressure of 1013.25 hPa);
- a power emitted by the source of the reactor comprised between 100 W and 1000 W;
- a bias voltage of the substrate comprised between 0 V and 100 V, advantageously comprised between 0 V and 20 V, for example equal to 0 V (in order to limit or even to avoid the etching of the metal layer);
- a pressure in the chamber of the reactor comprised between 0.667 Pa (5 mTorr) and 13.332 Pa (100 mTorr);
- a temperature of substrate holder comprised between 10° and 100° C.; and
- a temperature of the walls of the chamber of the reactor greater than or equal to 100° C., for example comprised between 100° C. and 150° C.

The time of exposure of the metal layer 10 to the plasma is determined as a function of the density of the residues 11 that it is wished to obtain at the end of step S11 (and which conditions the final surface roughness of the metal layer 10). For the parameter ranges described previously, it is typically comprised between 30 s and 120 s.

The plasma may also be formed from a mixture of several reactive gases introduced into the chamber of the reactor. The mixture of reactive gasses comprises a fluorocarbon gas ($C_xF_y$), advantageously hydrogenated ($C_xH_yF_z$), and a depolymerising gas, such as dioxygen ($O_2$) or dinitrogen ($N_2$). The depolymerising gas prevents the deposition of a polymer material (i.e. carbon-containing) on the metal layer 10. The ratio of the flow rate of fluorocarbon gas over the flow rate of depolymerising gas is preferably comprised between 0.5 and 1.

After the fluorination/chlorination operation, the substrate may be extracted from the plasma reactor and exposed to ambient air, which contains humidity. The residues 11 begin to form on the surface of the metal layer 10 around one hour after being re-exposed to air (variable time depending on the humidity level).

Alternatively, the humid environment is generated in the plasma reactor (in other words in situ). After having accomplished the fluorination/chlorination operation in a first chamber of the reactor, the substrate is moved into a second chamber filled with water vapour to carry out the second operation.

The exposure of the metal layer 10 to the humid environment (second operation of step S11; by re-exposure to air or in the plasma reactor) is preferably accomplished at ambient temperature. Conversely, the water vapour plasmas normally used to clean surfaces (and notably to desorb species present on the surface, such as chlorine and fluorine) or to form a passivation oxide layer are formed at temperatures of the order of 100° C. to 200° C.

Generally speaking, the second embodiment of step S11 (formation of residues 11 by dry process) is faster and simpler to implement than the first embodiment (by wet process). It further procures better control of the size and the density of the residues 11.

The following step S12, represented by FIG. 1B, consists in etching the metal layer 10 through the residues 11, so as to transfer the pattern 12 formed by the residues 11 into the metal layer 10. In other words, the residues 11 are used as a hard mask to etch the metal layer 10.

The transfer of the pattern 12 into the metal layer 10 has the effect of increasing the surface roughness of the metal layer 10, up to a final value greater than or equal to 10 nm, and preferably comprised between 10 nm and 30 nm (limits included).

The metal layer 10 is preferably etched by means of an etching method having a low selectivity with respect to the residues 11, that is to say having a selectivity comprised between 1 and 2 (limits included). The pattern 12 is thus transferred into the metal layer 10 substantially identically.

The metal layer 10 is advantageously etched until all the residues 11 have been consumed (in other words until all the hard mask has been consumed). This avoids the need for an additional step of removal of the residues 11 in a selective manner with respect to the metal layer 10.

Step S12 of etching of the metal layer 10 may be accomplished by reactive ion etching (RIE). In particular, it may be accomplished in the same plasma reactor as that used to form the residues 11 (step S11), in order to further simplify the roughening method. For example, the etching of the metals Ti, Ta, TiN and TaN is possible by RIE using a chlorine or fluorine based chemistry.

The roughening method of FIGS. 1A-1B is applicable to several metals (in particular Ti, Ta, TiN and TaN) and does not require developing a plasma etching recipe specific to each metal. Further, it is particularly simple to implement.

According to a first exemplary embodiment of the roughening method, the metal layer 10 is made of TiN, the residues 11 are formed at step S11 by reaction with an acid containing fluorine (e.g. $CF_6$ plasma+humid environment or aqueous solution of HF) and the metal layer 10 is etched at step S12 by a chlorine based RIE plasma.

According to a second exemplary embodiment, the metal layer 10 is made of Ti, Ta or TaN, the residues 11 are formed at step 311 by reaction with an acid containing chlorine (e.g. aqueous solution of HCl) and the metal layer 10 is etched at step S12 by a chlorine based RIE plasma.

The roughening method may further comprise a step of oxidation of the surface of the metal layer 10, before step S11 of formation of the residues 11. This prior oxidation is advantageous, because it increases the kinetic of formation of the residues 11. The surface of the metal layer 10 may be oxidised by exposing it either to ambient air after the deposition of the metal layer 10 on the substrate, or to a plasma containing oxygen (preferably in the same plasma reactor as that used at step S11) or by carrying out an annealing of the metal layer 10 under oxygen.

An example of application of the roughening method will now be described in relation with FIGS. 2A-2C.

This example of application relates to a method for manufacturing a resistive random access memory cell, for example of OxRAM type. A resistive random access memory cell conventionally comprises a first electrode designated lower electrode, a second electrode designated upper electrode, and a resistive layer (also called active layer) arranged between the lower and upper electrodes. The resistive layer is formed of a material with variable electrical resistance, an oxide in the case of an OxRAM cell.

Figure 2A:
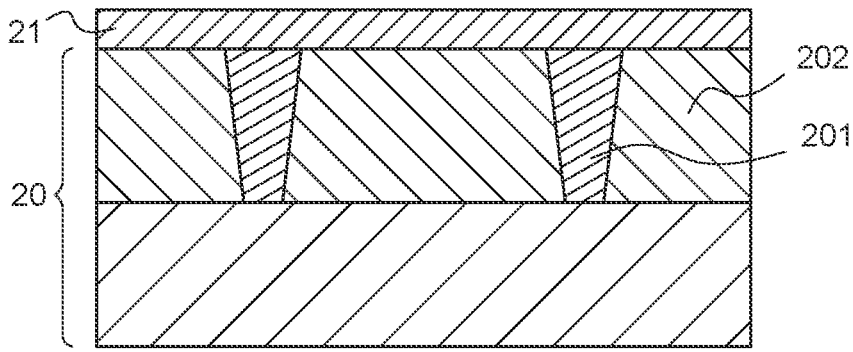
FIG. 2A, FIG. 2B and FIG. 2C represent the steps of a method for manufacturing a resistive random access memory cell, wherein the method of FIGS. 1A-1B is implemented.
Figure 2B:
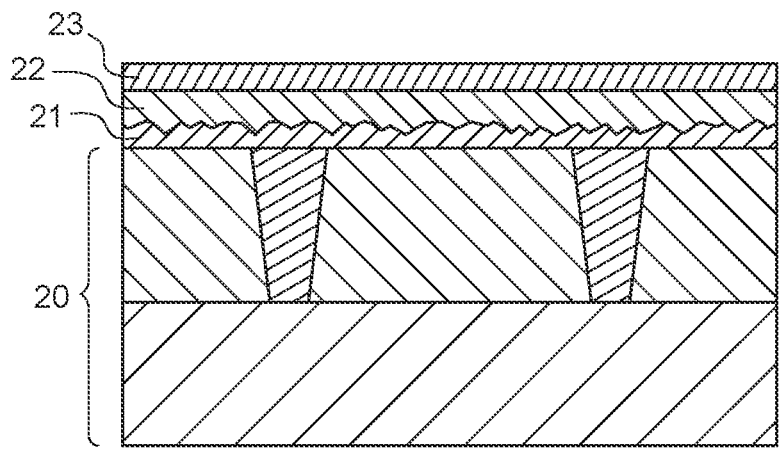
Figure 2C:
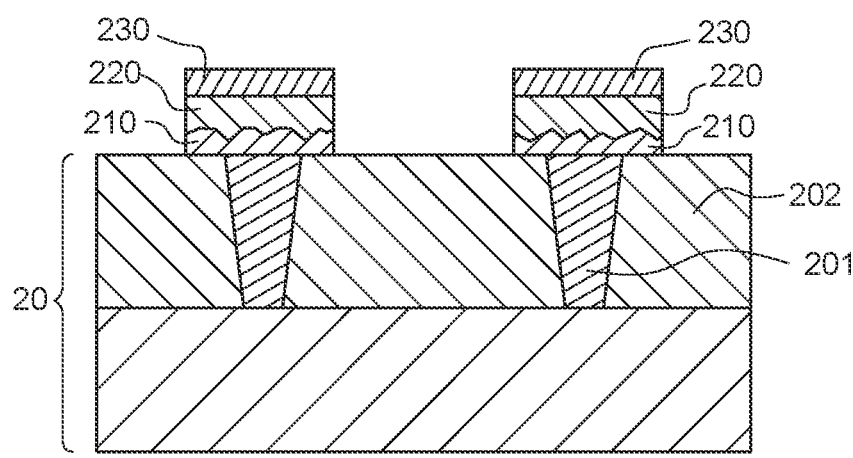

FIGS. 2A to 2C schematically represent steps S21 to S23 of the method for manufacturing the resistive random access memory cell.

Step S21 of FIG. 2A consists in depositing a first metal layer 21 on a substrate 20. For example, the first metal layer 21 is formed of titanium nitride (TiN) and its thickness is comprised between 100 nm and 150 nm.

The substrate 20 may notably comprise active components (e.g. transistors), connected together by one or more interconnection levels (or metal levels) to form a CMOS logic circuit (typically a reading circuit). Each interconnection level comprises metal vias and/or metal lines 201 embedded in one or more dielectric layers 202.

The first metal layer 21 is deposited on an interconnection level (for example the first metal level M1) so as to be in contact with the metal lines 201 of this level. Thus, in this example, the memory cell is formed within the BEOL (Back End Of Line) functional block of a CMOS circuit.

The surface roughness of the first metal layer 21 is next increased by means of the roughening method described in relation with FIGS. 1A-1B, The final surface roughness of the first metal layer 21 is advantageously greater than or equal to 2 nm, preferably comprised between 3 nm and 15 nm, in order to decrease in a significant manner the forming voltage of the memory cell.

At step S22 of FIG. 2B, a layer of material with variable electrical resistance 22 is next deposited on the first metal layer 21, then a second metal layer 23 is deposited on the layer of material with variable electrical resistance 22. The material with variable electrical resistance may be an oxide, preferably a transition metal oxide such as hafnium oxide ($HfO_2$). The second metal layer 22 is for example formed of titanium nitride (TiN). The thickness of the layer of material with variable electrical resistance 22 may be comprised between 5 nm and 20 nm and the thickness of the second metal layer 22 comprised between 100 nm and 150 nm.

Finally, at step S23 of FIG. 2C, the first metal layer 21, the layer of material with variable electrical resistance 22 and the second metal layer 23 are etched in such a way as to delimit respectively the lower electrode 210, the resistive layer 220 and the upper electrode 230 of the resistive random access memory cell. The etching may be carried out by RIE through a hard or resin mask, formed by photolithography and removed after the etching. The etching of the lower electrode (e.g. TiN) by RIE may be selective with respect to the dielectric layer 202 (e.g. $SiO_2$) of the interconnection level, such that there is no transfer of roughness into this dielectric layer 202.

Several memory cells (each comprising a lower electrode 210—resistive layer 220—upper electrode 230 stack) may be formed simultaneously at the etching step S3, as illustrated in FIG. 2O. The lower electrode 210 of each memory cell is in contact with a metal line 201 of the interconnection level.

The invention claimed is:

1. A method for increasing a surface roughness of a metal layer based on titanium, tantalum, tungsten, gold, nickel and/or aluminum, comprising:

fixing fluorine or chlorine on the surface of the metal layer, by exposing the metal layer to a plasma formed from a reactive gas containing fluorine or chlorine;

after fixing fluorine or chlorine on the surface of the metal layer, exposing the surface of the metal layer to a humid environment to produce an acid, by reaction of hydrogen from the humid environment with the fluorine or the chlorine fixed on the surface of the metal layer, the acid reacting with the metal to form residues, the whole of the residues forming a pattern on the surface of the metal layer, and after forming the residues, etching the metal layer through the residues, so as to transfer the pattern into the metal layer.

2. The method according to claim 1, wherein the metal layer is etched by an etching method having a selectivity with respect to the residues comprised between 1 and 2.

3. The method according to claim 1, wherein the metal layer is etched until all the residues are removed.

4. The method according to claim 1, wherein the reactive gas is a non-polymerising gas containing fluorine.

5. The method according to claim 4, wherein the reactive gas is sulphur hexafluoride ($SF_6$) or nitrogen trifluoride ($NF_3$).

6. The method according to claim 1, wherein the plasma is formed from a mixture of reactive gases comprising a fluorocarbon gas ($C_xF_y$) and a depolymerising gas.

7. The method according to claim 1, wherein the humid environment is ambient air.

8. The method according to claim 1, wherein the humid environment is generated in a chamber of a plasma reactor.

9. The method according to claim 1, further comprising a step of oxidation of the surface of the metal layer before the step of formation of the residues.

10. The method according to claim 1, wherein the metal layer is made of titanium (Ti), titanium nitride (TiN), tantalum (Ta), tantalum nitride (TaN), titanium oxynitride or titanium oxynitride.

11. The method according to claim 1, wherein the plasma used to fixe fluorine or chlorine on the surface of the metal layer has no etching role.

* * * * *